United States Patent
Li et al.

(10) Patent No.: US 11,825,756 B2
(45) Date of Patent: Nov. 21, 2023

(54) PREPARATION METHOD OF BIPOLAR GATING MEMRISTOR AND BIPOLAR GATING MEMRISTOR

(71) Applicant: HUAZHONG UNIVERSITY OF SCIENCE AND TECHNOLOGY, Hubei (CN)

(72) Inventors: Yi Li, Hubei (CN); Yuhui He, Hubei (CN); Yaoyao Fu, Hubei (CN); Xiaodi Huang, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 29 days.

(21) Appl. No.: 17/785,916

(22) PCT Filed: Aug. 30, 2021

(86) PCT No.: PCT/CN2021/115341
§ 371 (c)(1),
(2) Date: Jun. 16, 2022

(87) PCT Pub. No.: WO2022/257280
PCT Pub. Date: Dec. 15, 2022

(65) Prior Publication Data
US 2023/0301215 A1  Sep. 21, 2023

(30) Foreign Application Priority Data
Jun. 8, 2021 (CN) .......................... 202110639876.0

(51) Int. Cl.
*H10N 70/00* (2023.01)
*H10N 70/20* (2023.01)
*H10B 63/00* (2023.01)

(52) U.S. Cl.
CPC .......... *H10N 70/826* (2023.02); *H10B 63/22* (2023.02); *H10B 63/84* (2023.02); *H10N 70/026* (2023.02); *H10N 70/245* (2023.02)

(58) Field of Classification Search
CPC .. H10N 70/826; H10N 70/026; H10N 70/245; H10B 63/22; H10B 63/84
See application file for complete search history.

(56) References Cited

U.S. PATENT DOCUMENTS 9,634,247 B2 * 4/2017 Chen ...................... H10N 70/24
2014/0117298 A1   5/2014 Chen et al.

FOREIGN PATENT DOCUMENTS

| CN | 101621115 | 1/2010 |
|---|---|---|
| CN | 106575655 | 4/2017 |

(Continued)

OTHER PUBLICATIONS

"International Search Report (Form PCT/ISA/210) of PCT/CN2021/115341," dated Mar. 9, 2022, pp. 1-4.

(Continued)

*Primary Examiner* — Allison Bernstein
(74) *Attorney, Agent, or Firm* — JCIPRNET

(57) ABSTRACT

The present invention provides a preparation method of a bipolar gating memristor and a bipolar gating memristor. The preparation method includes: preparing a lower electrode; depositing a resistive material layer on the lower electrode; and depositing an upper electrode on the resistive material layer by using a magnetron sputtering manner to deposit the upper electrode, controlling upper electrode metal particles to have suitable kinetic energy by controlling sputtering power, controlling a vacuum degree of a region where the upper electrode and the resistive material layer are located, such that a redox reaction occurs spontaneously between the upper electrode and the resistive material layer during the deposition of the upper electrode to form a (Continued)

built-in bipolar gating layer; and continuously depositing the upper electrode on the built-in bipolar gating layer.

7 Claims, 4 Drawing Sheets

(56) References Cited

FOREIGN PATENT DOCUMENTS

| | | |
|---|---|---|
| CN | 106856221 | 6/2017 |
| CN | 107204397 | 9/2017 |
| CN | 109888093 | 6/2019 |

OTHER PUBLICATIONS

"Written Opinion of the International Searching Authority (Form PCT/ISA/237) of PCT/ CN2021/115341," dated Mar. 9, 2022, pp. 1-4.

* cited by examiner

PREPARATION METHOD OF BIPOLAR GATING MEMRISTOR AND BIPOLAR GATING MEMRISTOR

CROSS-REFERENCE TO RELATED APPLICATION

This application is a 371 of international application of PCT application serial no. PCT/CN2021/115341, filed on Aug. 30, 2021, which claims the priority benefit of China application no. 202110639876.0, filed on Jun. 8, 2021. The entirety of each of the above mentioned patent applications is hereby incorporated by reference herein and made a part of this specification.

BACKGROUND

Technical Field

The disclosure belongs to the field of microelectronic devices, and more particularly, relates to a preparation method of a bipolar gating memristor and a bipolar gating memristor.

Description of Related Art

In the age of the Internet of Things, unprecedented growth in data volumes drives the development of efficient, inexpensive, and micro storage technologies. With Moore's Law facing a bottleneck, the continued scaling of complementary metal oxide semiconductor semiconductors (CMOS) will lead to significant cost increases. In recent years, memristors, which are cheap, simple in structure, scalable, exhibiting low power consumption, reliable, and non-volatile, have become one of the most promising storage technologies for logistics network applications. Memristors have a simple sandwich device structure and are therefore suitable for large-scale 2D or 3D integration using passive cross-array structures. The characteristic of a cross-array structure is that the memory cells are located at the intersections of the word lines and bit lines that are perpendicular to each other. Theoretically, the minimum size allowed by the cross-array structure is $4F^2/n$, where F is the minimum feature size and n is the number of stacked layers, and the integration density is excessively high. In a cross array with high integration density, around selected cells, low-ohmic conduction paths are provided on many unselected cells, and the leakage current problem thereby arise. The sum of the currents in these low-ohmic paths is sufficient to affect the information read results of the selected cells and the read margin range and greatly limits the size of the array. In order to prevent this problem from occurring, in a scheme compatible with the cross-array structure, the stack structure of the memristor and the diode is limited by the insufficient forward current density of the diode and the immaturity of the unipolar memristor. In addition, in a structure with two memristors in reverse series, there is also an inherently destructive read process that has a huge impact on the speed of operation, complexity, and power consumption. In comparison, the stack structure of the gating device and the memristor is one of the effective solutions to suppress the leakage current path and is compatible with the cross-array structure. This is because the gating device has high nonlinearity, high endurance, and high on/off current.

At present, the process preparation of high-performance bipolar gating devices is difficult, and human control of the preparation parameters is required to tune the fixed stoichiometric ratio of its materials, otherwise the gating properties will not be exhibited. The prepared gating layer thin film material subsequently requires high temperature annealing up to several hundred degrees to transform into a crystalline state to exhibit gating properties. Besides, when the layer is stacked with the resistive layer, the ultra-high temperature annealing may cause significant damage to the stable properties of the memristor layer. The prepared gating layer thin film material subsequently needs a large voltage initialization process to transform into a crystalline state to exhibit gate properties, but this large voltage puts enormous pressure on the design complexity of peripheral circuits. The diffusion problem at the interface after stacking with the memristor may have an irreversible impact on the stable electrical properties of the gating layer and the resistive layer. These problems make it difficult for the performance indicators of such devices to reach the commercial application of memory.

In summary, the process preparation difficulty of the existing high-performance bipolar gating devices is complicated. For instance, the stoichiometric ratio of its materials needs to be precisely regulated, the prepared thin film materials require subsequent high-temperature annealing up to several hundred degrees, the memristors need to be independently stacked to ensure their reliability and difference, and a large voltage is required for initialization. As a result, it is difficult to realize commercial application of such devices in combination with memory.

SUMMARY

In view of the shortcomings of the related art, the purpose of the disclosure is to provide a preparation method of a bipolar gating memristor and a bipolar gating memristor, aiming to solve the problem of complexity of the process preparation difficulty of the existing high-performance bipolar gating devices, for example, the stoichiometric ratio of its materials needs to be precisely regulated, the prepared thin film materials require subsequent high-temperature annealing up to several hundred degrees, the memristors need to be independently stacked to ensure their reliability and difference, and a large voltage is required for initialization.

To achieve the foregoing purpose, in the first aspect, the disclosure provides a preparation method of a bipolar gating memristor, and the method includes the following steps.

A lower electrode is prepared.

A resistive material layer is deposited on the lower electrode, and the resistive material layer a one-element or multi-element metal oxide material.

An upper electrode is deposited on the resistive material layer. The step of depositing the upper electrode includes the following. A magnetron sputtering method is used to deposit the upper electrode on the resistive material layer. Upper electrode metal particles are controlled to have suitable kinetic energy by controlling sputtering power. A vacuum degree of a region where the upper electrode and the resistive material layer are located is controlled, such that a redox reaction occurs spontaneously between the upper electrode and the resistive material layer during the deposition of the upper electrode. A built-in bipolar gating layer is formed. The upper electrode is continuously deposited on the built-in bipolar gating layer.

An oxide of the upper electrode metal material has bipolar gating properties, and a material of the built-in bipolar gating layer is the oxide of the upper electrode metal material. The lower electrode, the resistive material layer, the built-in bipolar gating layer, and the upper electrode form the bipolar gating memristor. The bipolar gating memristor is in an off state when forward and reverse voltages are less than or equal to a threshold voltage, and the resistive material layer is erased and written when the forward and reverse voltages are greater than the threshold voltage.

In an optional embodiment, the upper electrode metal material is any one of Nb, V, Ni, Cr, Ti, Co, Zr, and Ru.

In an optional embodiment, a thickness of the built-in bipolar gate layer is controlled to be 1 nm to 10 nm by controlling the redox reaction.

In an optional embodiment, the step of controlling the vacuum degree of the region where the upper electrode and the resistive material layer are located specifically includes the following.

A vacuum degree of a region to be controlled is controlled by extracting air in the region to be controlled, inert gas is introduced to the region to be controlled, and a speed of introducing the inert gas is controlled, where the vacuum degree of the region to be controlled is controlled at $5*10^{-3}$ Pa to $5*10^{-4}$ Pa.

In an optional embodiment, a material of the lower electrode is any one of Pt, Au, Ta, Al, Pd, Hf, W, TiN, and TiW.

In an optional embodiment, a thickness of the upper electrode is 50 nm to 1 μm, a thickness of the resistive material layer is 5 nm to 50 nm, and a thickness of the lower electrode is 50 nm to 1 μm.

In the second aspect, the disclosure provides a bipolar gating memristor which is obtained through the preparation method provided in the first aspect. When magnitude of a forward voltage or a reverse voltage applied outside the bipolar gating memristor reaches a threshold voltage of the built-in bipolar gating layer, a crystallized region is formed in the built-in bipolar gating layer, and a resistance state of the built-in bipolar gating layer changes from an off-state resistance state to an on-state resistance state, such that the bipolar gating memristor exhibits bidirectional switch properties.

During the formation of the built-in bipolar gating layer, some oxygen vacancy crystal grain regions are formed in the resistive material layer, the oxygen vacancy crystal grain regions reduce an initial resistance of a bipolar gating memristor device, and the oxygen vacancy crystal grain regions are treated as seeds in a process of resistive change of the resistive material layer to form a crystallized conductive filament.

To sum up, the above technical solutions provided by the disclosure have the following beneficial effects compared with the related art.

The disclosure provides a preparation method of a bipolar gating memristor and a bipolar gating memristor. Through a redox reaction between the upper electrode and the resistive material during a preparation process of physical deposition, the built-in bipolar gating layer of the upper electrode element is formed by spontaneous oxidation at the interface between the upper electrode and the resistive material. The upper electrode takes oxygen from the oxygen-containing resistive material layer to undergo a reduction reaction, so that a large number of oxygen vacancy crystal grain regions are formed in the resistive material layer. These regions show a low resistance state, so that the initial resistance of the entire device is greatly reduced, and the process of avoiding large voltage initialization is realized. Since the gating layer in the disclosure is formed by spontaneous redox reaction with the resistive layer in the process of preparing the upper electrode, no additional high-temperature annealing treatment is required. Further, the presence of the spontaneous oxide layer just solves the problem of interfacial diffusion. Besides, the oxygen vacancy crystal grain regions in the resistive material layer may also be used as seeds for the subsequent resistive material layer to undergo resistive transformation to form a crystallized conductive filament, the conductive filament formation region is localized, and therefore, the cycle-to-cycle and device-to-device variability of the entire device is greatly reduced, and the pulse erasing and writing times and holding capability of the device are improved.

The disclosure provides a preparation method of a bipolar gating memristor and a bipolar gating memristor. The overall device prepared by the disclosure exhibits stable built-in bipolar gated memristive properties, and the device may have multiple operation modes. Bipolar gating properties are exhibited over a small voltage operating range. This layer exhibits good bidirectional switching properties. The pulse switching speed is less than 20 ns, the high-low resistance switching ratio is greater than 100, the high on-state current is greater than 1 mA, the number of times of endurance of erasing and writing is greater than $10^{12}$, and the cycle-to-cycle and device-to-device variability is small, less than 6%. A curve of memristive properties with built-in bipolar gating is exhibited in a large voltage operating range. Due to the presence of the built-in bipolar gating layer, when a voltage is lower than a threshold turn-on voltage in this property, it may be forcibly turned off, and the resistive layer may be erased and written only when the voltage is greater than its threshold voltage. Therefore, the built-in layer may effectively limit the leakage current path problem in the large-scale cross-array structure and exhibits good application value because the integration scale may be significantly improved without requiring additional process complexity. In addition, the built-in gating layer reduces the on-state current of the overall memristive device by at least 100 times (the on-state current drops from mA to uA due to the turn-off of the gating layer), which means that the turn-on power consumption of the memristive device is also reduced by at least 100 times.

Figure 1:
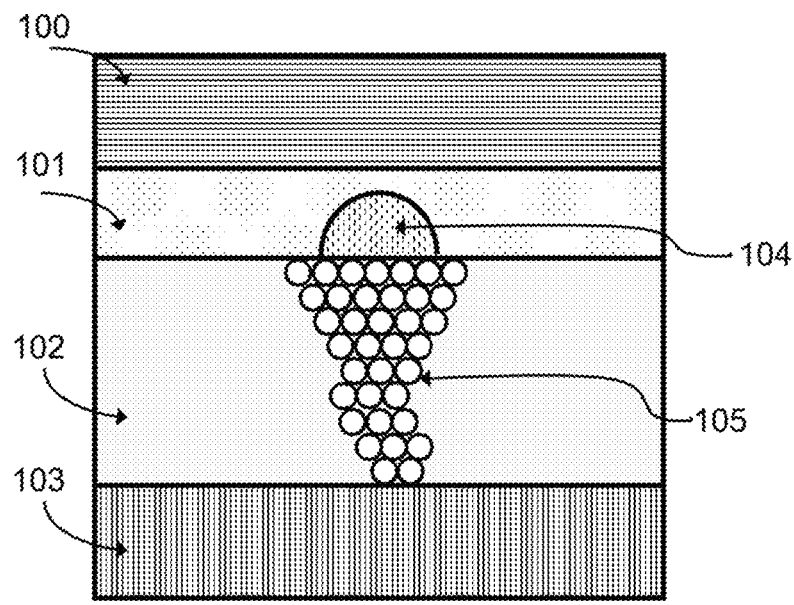
FIG. 1 is a simplified cross-sectional view of a structure of a memristor with built-in bipolar gating properties according to an embodiment of the disclosure.

In the accompanying drawings, the same reference numerals are used to represent identical or similar elements or structures and specifically includes: 100: upper electrode, mainly any one of metal niobium (Nb), vanadium (V), nickel (Ni), chromium (Cr), titanium (Ti), cobalt (Co), zirconium (Zr), and ruthenium (Ru); 101: built-in bipolar gating layer formed by spontaneous oxidation; 102: resistive material layer, mainly a one-element or multi-element metal oxide material; 103: lower electrode, mainly any one of Pt, Au, Ta, Al, Pd, Hf, W, TiN, and TiW; 104: crystallized region formed after the built-in bipolar gating layer reaches a threshold voltage; and 105: crystallized conductive filament region formed after a resistive material reaches a turn-on voltage.

DESCRIPTION OF THE EMBODIMENTS

In order to make the objectives, technical solutions, and advantages of the disclosure clearer and more comprehensible, the disclosure is further described in detail with reference to the drawings and embodiments. It should be understood that the specific embodiments described herein serve to explain the disclosure merely and are not used to limit the disclosure.

Therefore, the disclosure provides a novel memristive device structure with built-in bipolar gating and a preparation method thereof. Devices based on this reliable structure may show good overall performance improvements, such as no high-voltage initialization process, fabrication at room temperature, simple structure, good performance in multiple operating modes, and no need for a high-temperature annealing step. A built-in bipolar gating memristor cross-array stack structure based on the disclosure may provide the hardware foundation for the next-generation non-volatile memory, full memristive neural network architecture, and reconfigurable logic circuits.

The disclosure provides a gated memristor and a preparation method thereof in view of the abovementioned problems in process preparation. The spontaneous oxidation process of an upper electrode and a resistive material during a fabrication process forms good built-in bipolar gating properties, so that the cross-array stack structure is able to provide the hardware foundation for the next generation of non-volatile memory, full memristive neural network architecture, and reconfigurable logic circuits.

After a large number of experimental studies, the disclosure develops a memristive device with good built-in bipolar gate properties through a spontaneous oxidation process of an upper electrode and a resistive material in a preparation process. The device includes an upper electrode, a resistive material layer, and a lower electrode from top to bottom. The upper electrode adopts any one of metal niobium (Nb), vanadium (V), nickel (Ni), chromium (Cr), titanium (Ti), cobalt (Co), zirconium (Zr), and ruthenium (Ru), the resistive material is a one-element or multi-element metal oxide material, and the lower electrode adopts any one of Pt, Au, Ta, Al, Pd, Hf, W, TiN, and TiW.

Further, in a deposition process of the upper electrode described in the abovementioned technical solution using the magnetron sputtering process, by controlling sputtering power and background vacuum, a redox reaction occurs between the upper electrode and the resistive material, so that an oxide layer of the upper electrode material element is spontaneously formed at an interface between the upper electrode and the resistive material. A thickness of the oxide layer is approximately 1 nm to 10 nm.

Further, the upper electrode element oxide described in the above technical solution has bipolar gating properties.

Further, in the deposition process of the upper electrode described in the abovementioned technical solution using the magnetron sputtering process, due to the influence of power and background vacuum, a redox reaction may occur between the upper electrode and the resistive material, so that a large number of crystal grain regions may appear in the resistive layer film, and these regions exhibit low resistance properties.

Further, a thickness of the upper electrode is 50 nm to 1 μm, a thickness of the resistive material is 5 nm to 50 nm, and a thickness of the lower electrode is 50 nm to 1 μm in the abovementioned technical solution.

Further, a feature size of the memristive device with built-in bipolar gating properties described in the above technical solution is 2 nm to 1,000 nm.

The embodiments of the disclosure are described in detail with reference to FIG. 1 to FIG. 10 as follows.

FIG. 1 is a simplified cross-sectional view of a structure of a memristor with built-in bipolar gating properties according to an embodiment of the disclosure. Herein, a built-in bipolar gating layer 101 is spontaneously formed with a resistive material 102 during a preparation process of an upper electrode 100. Through a redox reaction between the upper electrode 100 and the resistive material 102 during a preparation process of physical deposition, the built-in bipolar gating layer 101 of an upper electrode element is formed by spontaneous oxidation at an interface between the upper electrode and the resistive material in the disclosure. This layer exhibits good bidirectional switching properties. When magnitude of an externally applied voltage on the entire device reaches a threshold voltage of the built-in bipolar gating layer, a crystallized region 104 is formed. A resistance state of this layer changes from off-state resistance to on-state resistance. This layer exhibits good bidirectional switching properties. A pulse switching speed is <20 ns, a high-low resistance switching ratio is >100, a high on-state current is >1 mA, a number of times of endurance of erasing and writing is >$10^{12}$, and cycle-to-cycle and device-to-device variability is small <6%.

The upper electrode material may undergo a redox process with the resistive material layer, so that the resistive material layer loses much oxygen, and a large number of oxygen vacancy crystal grain regions are thereby formed in the resistive material layer. These regions show a low resistance state, so that the initial resistance of the entire device is greatly reduced, and the process of avoiding large voltage initialization is realized. Besides, these regions may also be used as seeds for the subsequent resistive material layer to undergo resistive transformation to form a crystallized conductive filament 105, and therefore, the cycle-to-cycle and device-to-device variability of the entire device is greatly reduced, and the pulse erasing and writing times and holding capability of the device are improved.

The overall device prepared by the disclosure exhibits stable built-in bipolar gated memristive properties, and the device may have multiple operation modes. Bipolar gating properties are exhibited in a small voltage operating range, and a curve of memristive properties with built-in bipolar gating is exhibited in a large voltage operating range. Due to the presence of the built-in bipolar gating layer, when a voltage is lower than a threshold turn-on voltage in this property, it may be forcibly turned off, and the resistive layer may be erased and written only when the voltage is greater than its threshold voltage. Therefore, the built-in layer may effectively limit the leakage current path problem in the large-scale cross-array structure and exhibits good application value because the integration density may be significantly improved without requiring additional process complexity.

Figure 2:
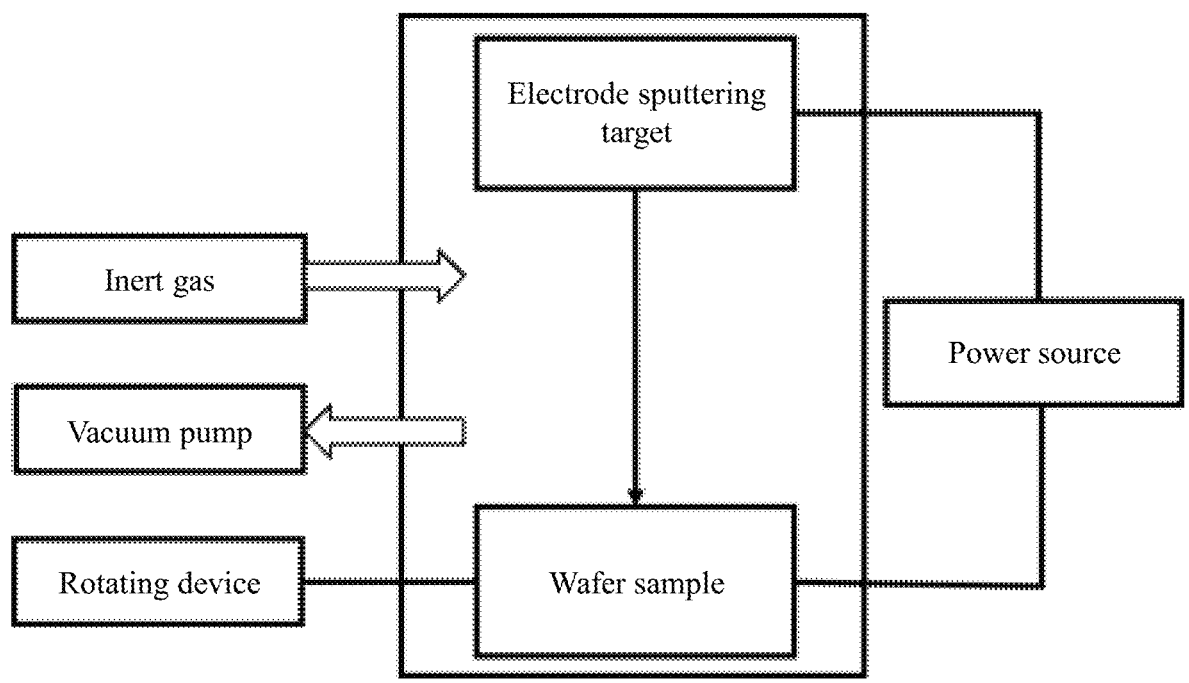
FIG. 2 is a simplified diagram of a preparation system for preparing an electrode material by sputtering according to an embodiment of the disclosure.

FIG. 2 is a simplified diagram of a preparation system for preparing a resistive material by sputtering according to an embodiment of the disclosure. As shown in FIG. 2, the upper electrode 100 and the lower electrode 103 are prepared by physical vapor deposition, and a gas atmosphere is inert gas, such as argon. A background vacuum degree of the upper electrode 100 during sputtering is balanced and controlled by the extraction of a vacuum pump and an inert gas introduction speed, and a suitable vacuum degree range is $5*10^{-3}$ Pa to $5*10^{-4}$ Pa. Within this range, metal particles bombarded by an upper electrode target applied by a power supply have large kinetic energy and thus undergo a redox reaction with the sample on which the lower electrode and the resistive material layer are prepared, and the built-in bipolar gating layer 102 is thereby formed spontaneously. The background vacuum degree of the lower electrode 103 during sputtering is balanced and controlled by the extraction of the vacuum pump and the inert gas introduction speed, and the suitable vacuum degree range is $<9*10^{-4}$ Pa. Within this range, the lower electrode may be guaranteed not to be oxidized during the preparation process. In the process of depositing the upper and lower electrodes, it is necessary to give a wafer sample a rotating device, and keep it rotating at a fixed and constant speed. A speed selection range is 10 rpm to 15 rpm, which ensures that the film material deposited on each position of the sample is uniform.

Figure 3:
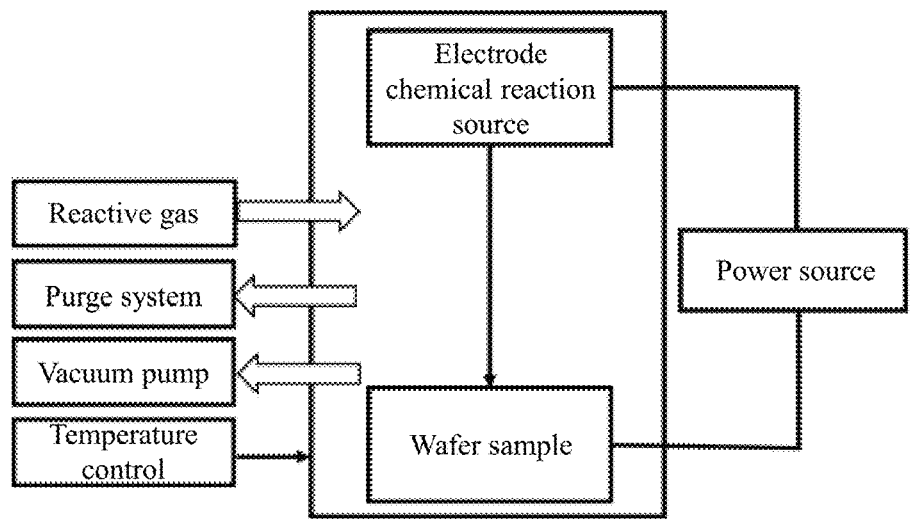
FIG. 3 is a simplified diagram of yet another preparation system for preparing an electrode material by chemical deposition according to an embodiment of the disclosure.

In another embodiment of a simplified diagram of an electrode deposition system for forming a built-in gating layer, as shown in FIG. 3, it is a simplified diagram of a system for forming resistive materials with high and low vacancy concentrations by chemical vapor deposition. The system consists of a vacuum tank that includes a reaction source for electrode material and a wafer substrate. The reaction source is a raw material for chemical reaction and is connected to an external power source to control the reaction process. The vacuum tank is equipped with a mechanical pump or a vacuum pump to pump the vacuum degree in the chamber before deposition to at least $10^{-3}$ Pa or less. The vacuum tank is equipped with a reactive gas source to provide the raw materials required for different electrodes. The tank also includes a purging system after each deposition cycle, which is used to take away the remaining reaction materials in the chamber, ensuring that the proportion of reaction materials is precisely controlled in each reaction cycle. The tank may also include a temperature control system to control the reaction temperature in the vacuum chamber, ranging from 50° C. to 500° C. After using the corresponding reaction source and adjusting the reaction parameters, different electrode materials may be deposited on the wafer substrate. When chemical vapor deposition is used to form a memristive device with built-in gate, since the activity of the metal element of the upper electrode needs to be greater than that of the metal element of the resistive material layer, when the metal of the upper electrode is deposited on the surface of the resistive layer, a redox reaction may occur between the two, and an oxide layer of the upper electrode element, that is, a built-in gating layer, is formed at the interface between the two. FIG. 3 is only a simplified diagram for describing the present embodiment. Sputtering reaction tank are standard equipment in semiconductor fabrication plants and are available from various commercial sources.

Figure 4:
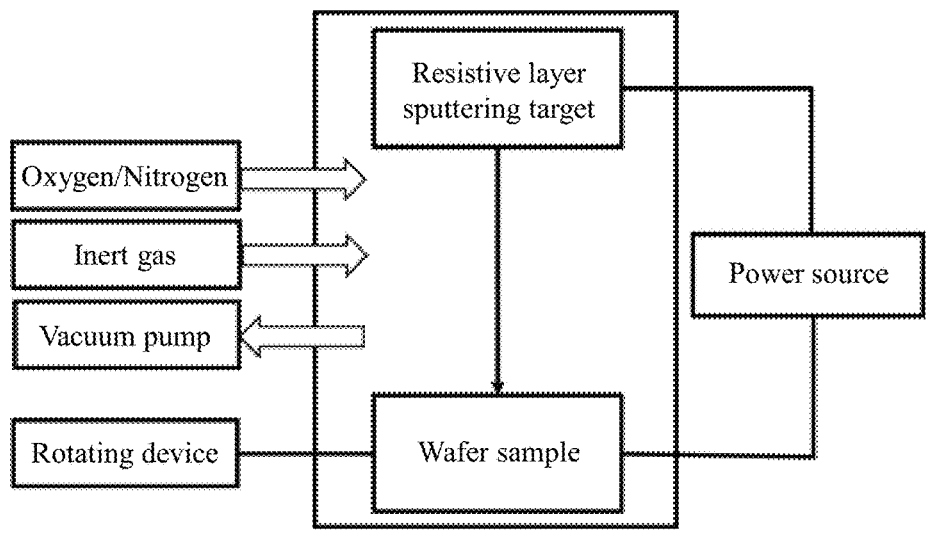
FIG. 4 is a simplified diagram of another preparation system for preparing a resistive material by sputtering according to an embodiment of the disclosure.

FIG. 4 is a simplified diagram of a preparation system for preparing a resistive material by sputtering according to an embodiment of the disclosure. The resistive material 102 is prepared by physical vapor deposition, and the gas atmosphere is inert gas and oxygen. The background vacuum degree of the resistive material 102 during sputtering is balanced and controlled by the extraction of the vacuum pump, the inert gas, and the oxygen introduction speed, and the suitable vacuum degree range is $>5*10^{-3}$ Pa. In the process of depositing the resistive material, it is necessary to give a wafer sample a rotating device, and keep it rotating at a fixed and constant speed. The speed selection range is 10 rpm to 15 rpm, which ensures that the film material deposited on each position of the sample is uniform.

In an embodiment of the disclosure, the upper electrode may be vanadium (V), the resistive layer may be hafnium tungsten covalent oxide (HWO), and the lower electrode may be platinum (Pt). The built-in bipolar gating layer formed by spontaneous oxidation at the interface between the upper electrode and the resistive layer may be $VO_x$, $0<x<2.5$.

Figure 5:
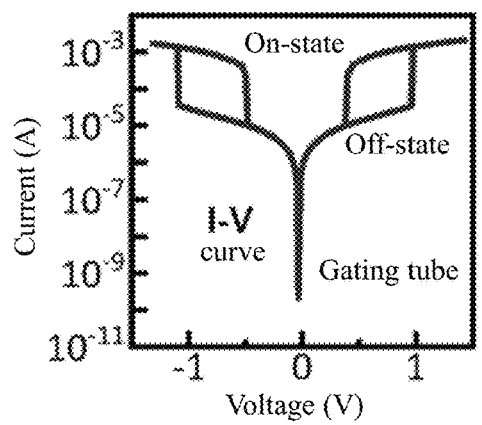
FIG. 5 is a graph of current-voltage properties of a memristor with built-in bipolar gating properties in a low-voltage operation mode according to an embodiment of the disclosure.

FIG. 5 is a graph of current-voltage properties of a memristor with built-in bipolar gating properties in a low-voltage operation mode according to an embodiment of the disclosure. Electrical properties of the abovementioned device are measured, and specifically, an operating voltage is applied to the upper electrode through a testing instrument, and the lower electrode is grounded. In the initial state, the resistive material layer has a low resistance, and the built-in gating layer has an off-state resistance, so the overall device resistance is represented by the off-state resistance of the built-in gating layer. During the forward operation of the device, the operating voltage increases from 0V to 1.5V and then back to 0V. During the application process of 0V to 1.5V, when the device reaches the threshold voltage (the threshold voltage of the built-in gating layer is approximately equal to 1V), a sudden change of the current value from small to large may occur, and the built-in gating layer is changed from high resistance to low resistance. During the application process of 1.5V to 0V, when the device reaches a holding voltage (the holding voltage of the built-in gating layer is approximately equal to 0.5V), a sudden change of the current value from small to large may spontaneously occur, and the built-in gating layer is changed from low resistance to high resistance. During the negative operation of the device, the operating voltage increases from 0V to −1.5V and then back to 0V. During the application process of 0V to −1.3V, when the device reaches a negative threshold voltage (the threshold voltage of the built-in gating layer is approximately equal to −1V), a sudden change of the current value from small to large may occur, and the built-in gating layer is changed from high resistance to low resistance. During the application process of −1.3V to 0V, when the device reaches a negative holding voltage (the negative holding voltage of the built-in gating layer is approximately equal to −0.5V), a sudden change of the current value from small to large may spontaneously occur, and the built-in gating layer is changed from low resistance to high resistance. Due to the presence of the built-in bipolar gating layer, when forward and reverse voltages are lower than the threshold turn-on voltage in this property, they may be forcibly turned off, and the resistive layer may be erased and written only when the forward and reverse voltages are greater than forward and reverse threshold voltages. Therefore, the built-in layer may effectively limit the leakage current path problem in the large-scale cross-array structure and exhibits good application value because the integration density may be significantly improved without requiring additional process complexity. This layer exhibits good bidirectional switching properties. The pulse switching speed is <20 ns, the high-low resistance switching ratio is >100, the high on-state current is >1 mA, the number of times of endurance of erasing and writing is >$10^{12}$, and the cycle-to-cycle and device-to-device variability is small <6%.

To be specific, as shown in FIG. 5, if the memristor properties provided by the disclosure are compared with the common memristor properties under large voltage, when the voltage is small, with the clamping of the built-in gating, the low resistance becomes the turn-off resistance of the gating layer, so the overall resistance increases. If the gating properties of the device are to be used, it is sufficient to operate at small voltages, typically for gating switches, neuron circuits, and so on. If the memristor properties of the device are to be used, the erasing and writing resistance state is completed by operating in a large voltage range, and the high and low resistance of reading at 0.1V may be used as non-volatile storage information.

Figure 6:
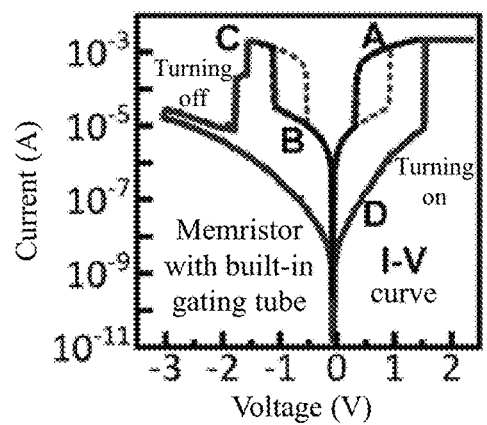
FIG. 6 is a graph exhibiting memristive properties with built-in bipolar gating of a memristor with built-in bipolar gating properties under a large voltage operating range according to an embodiment of the disclosure.

FIG. 6 is a graph exhibiting memristive properties with built-in bipolar gating of a memristor with built-in bipolar gating properties under a large voltage operating range according to an embodiment of the disclosure. The electrical properties of the abovementioned device are measured, and specifically, the operating voltage is applied to the upper electrode through a testing instrument, and the lower electrode is grounded. In the initial state, the resistive material layer has a high resistance, and the built-in gate layer has an off-state resistance, so the overall device resistance is represented by the high resistance of the resistive material layer. During the forward operation of the device, the operating voltage increases from 0V to 2.5V and then back to 0V. During the application process of 0V to 2.5V, when the device reaches a turn-on voltage (the turn-on voltage of the resistive layer is approximately equal to 1.5V and the threshold voltage of the built-in gating layer is approximately equal to 1V) of the resistive layer, a sudden change of the current value from small to large may occur, and both the resistive layer and the built-in gating layer are changed from high resistance to low resistance. During the application process of 1.5V to 0V, when the magnitude of an externally applied voltage is reduced to the holding voltage (the holding voltage of the built-in gating layer is approximately equal to 0.5V) of the built-in gating layer, a sudden change of the current value from small to large may spontaneously occur, and the built-in gating layer is changed from low resistance to high resistance. The turn-off resistance value of the built-in gating layer in the resistive state of the overall memristive device is large ***, so the on-state current of the overall memristive device is reduced by at least 100 times, which means that the turn-on power consumption of the device is also reduced by at least 100 times.

During the negative operation of the device, the operating voltage increases from 0V to -3V and then back to 0V. During the application process of 0V to -3V, when the device reaches the negative threshold voltage (the threshold voltage of the built-in gating layer is approximately equal to -1V), a sudden change of the current value from small to large may occur, and the built-in gating layer is changed from high resistance to low resistance. When the externally applied voltage continues to increase after the built-in gating layer is in the on state, the voltage drop falls on the resistive material layer, the resistive material layer undergoes a gradual change process of current from large to small, the resistive layer is turned off, and the resistance state is greater than the off-state resistance value of the built-in gating layer. During the application process of -3 to 0V, the overall resistance state of the device is determined by the resistive layer, so the overall device resistance shows a high resistance value. Due to the presence of the built-in bipolar gating layer, when the forward and reverse voltages are lower than the threshold turn-on voltage in this property, they may be forcibly turned off, and the resistive layer may be erased and written only when the forward and reverse voltages are greater than the forward and reverse threshold voltages. Therefore, the built-in layer may effectively limit the leakage current path problem in the large-scale cross-array structure and exhibits good application value because the integration density may be significantly improved without requiring additional process complexity. Under a large operating voltage range, the overall device exhibits good memristive properties with built-in bipolar gating, and the overall on-state and off-state resistances are 100k and 10M, respectively. Therefore, the overall power consumption of the device is reduced by at least 100 times, the switching ratio is >100, the number of times of endurance of erasing and writing is >$10^{10}$, and the resistance state holding time is >10,000 s at 85 degrees Celsius.

Figure 7:
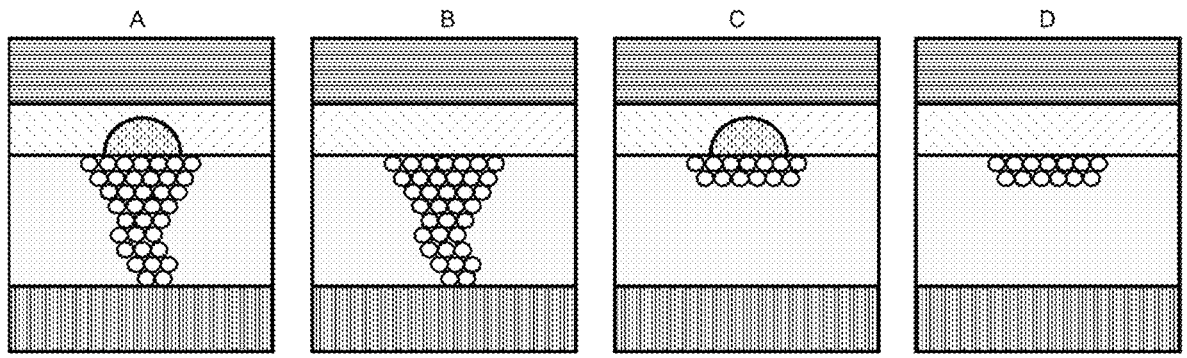
FIG. 7 is a model diagram of a device mechanism corresponding to the graph of memristive properties with built-in bipolar gating in different voltage ranges according to an embodiment of the disclosure.

FIG. 7 is a model diagram of a device mechanism corresponding to the graph of memristive properties with built-in bipolar gating in different voltage ranges according to an embodiment of the disclosure. Figure A corresponds to the application process in which the operating voltage in the graph of properties of FIG. 6 reaches the turn-on voltage of the resistive layer and does not decrease to the holding voltage of the built-in gating layer. When the device reaches the turn-on voltage (the turn-on voltage of the resistive layer is approximately equal to 1.5V and the threshold voltage of the built-in gating layer is approximately equal to 1V) of the resistive layer, a sudden change of the current value from small to large may occur. The resistive layer forms a through crystalline conductive filament, the built-in gating layer forms a hemispherical crystallized region resistive layer, and the built-in gating layer changes from high resistance to low resistance. Figure B corresponds to the application process in which an external-applied forward voltage is less than the forward threshold voltage and an external-applied reverse voltage is less than the negative threshold voltage when the resistive layer is turned on in the graph of properties of FIG. 6. The resistive layer has formed the through crystalline conductive filament, the built-in gating layer is turned on due to insufficient voltage drop, the resistive layer is low resistance, and the built-in resistive layer is in an off state. Figure C corresponds to the application process in which the externally-applied negative voltage in the graph of properties of FIG. 6 is greater than the negative threshold voltage of the built-in gating layer. The built-in gating layer is opened, the built-in resistive layer is in an open state, the main voltage drop is on the resistive layer, the resistive layer fuses the through crystalline conductive filament, and the resistive layer changes from low resistance to high resistance. Figure D corresponds to the external application of -3V to 0V after the resistive layer in the graph of properties in FIG. 6 is turned off. The resistance value of the resistive layer is greater than the turn-off resistance value of the gating layer, and the voltage drop falls on the resistive layer.

Figure 8:
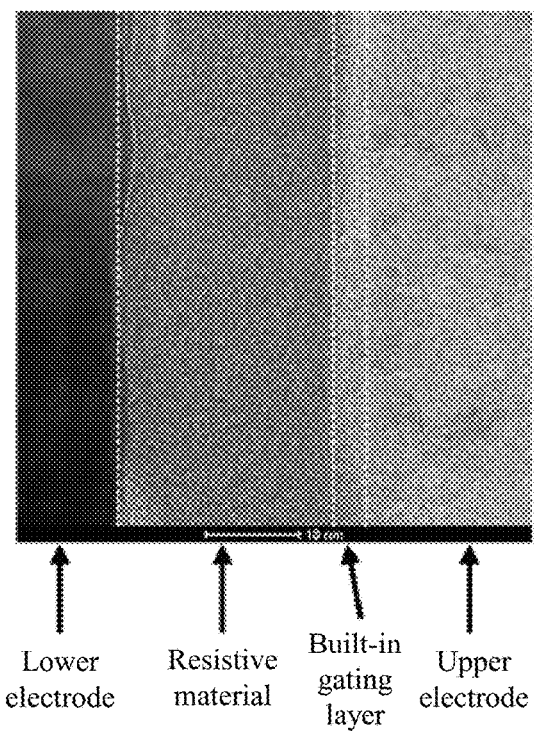
FIG. 8 is a TEM image of a memristor structure with built-in bipolar gating properties according to an embodiment of the disclosure.

FIG. 8 is a transmission electron microscope (TEM) image of a memristor structure with built-in bipolar gating properties. This figure from left to right shows a Pt lower electrode, an HWO resistive material layer, a built-in gating layer VOx formed by spontaneous oxidation during the preparation process, and a V upper electrode according to an embodiment of the disclosure. From the upper electrode to the resistive material layer, some spontaneously generated crystallized regions are provided.

Figure 9:
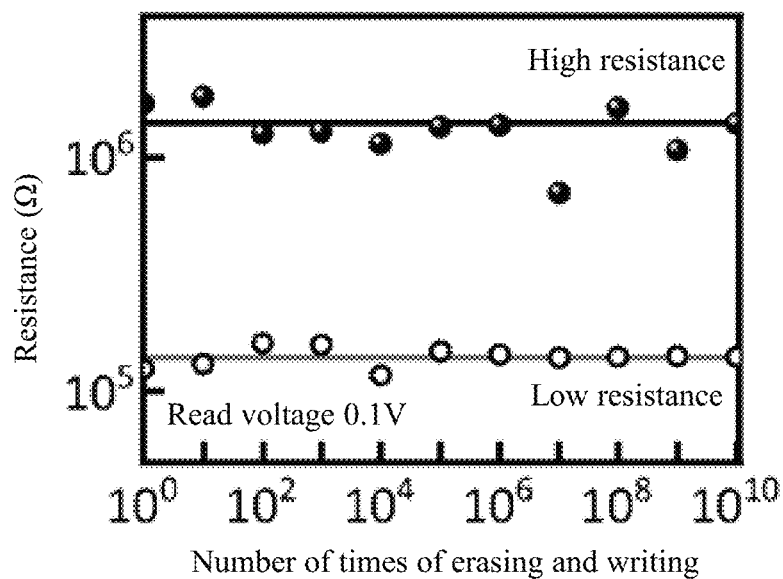
FIG. 9 is a schematic chart of cycling properties of the memristor with built-in bipolar gating properties according to an embodiment of the disclosure.

FIG. 9 is a chart of cycling properties of the memristor with built-in bipolar gating properties according to an embodiment of the disclosure. Pulse cycling properties of the device are measured, and the device is placed in a low resistance state using the operation method in FIG. 6. A single negative pulse (with an amplitude of −3V and a pulse width of 20 ns) is applied to the upper electrode of the device through the testing instrument, the lower electrode is grounded, and the device changes from a low resistance state to a high resistance state (reading the resistance state of the device with a small voltage). Next, a single positive pulse (with an amplitude of 2V and a pulse width of 20 ns) is applied to the upper electrode of the device through the testing instrument, the lower electrode is grounded, and the device changes from a low resistance state to a high resistance state (reading the resistance state of the device with a small voltage). The abovementioned positive and negative pulse pairs are repeatedly applied, the number of cycles is counted, and it may be clearly seen that the improved device of disclosure is able to keep the device undamaged after $10^{10}$ cycles. The erasing and writing capability of the device is greatly improved, ensuring that the device may perform high-speed and multiple operations in actual data accessing. In addition, the built-in gating layer reduces the on-state current of the overall device by at least 100 times, which means that the turn-on power consumption of the device is also reduced by at least 100 times.

Figure 10:
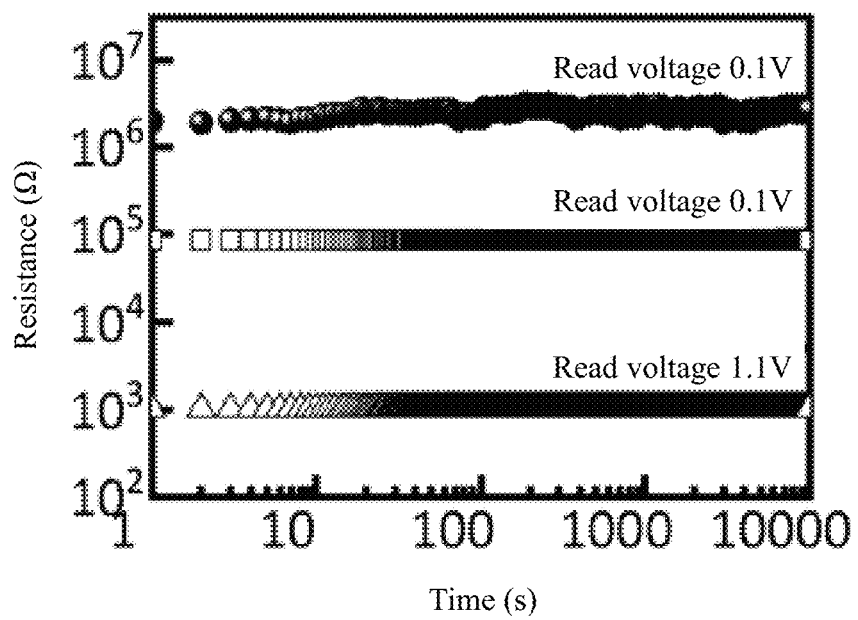
FIG. 10 is a schematic chart of holding properties of the memristor with built-in bipolar gating properties according to an embodiment of the disclosure.

FIG. 10 is a chart of holding properties of the memristor with built-in bipolar gating properties according to an embodiment of the disclosure. The holding properties of the device are measured, the ambient temperature is raised to 85° C., different voltages are applied to the upper electrode of the device and the resistance values are read (a highest resistance state read voltage is 0.1V, a low resistance read voltage when the gating layer is turned off is 0.1V, and a low resistance read voltage when the gating layer is turned on is 1.1V) through the testing instrument, and the lower electrode is grounded. It can be seen that the improved device provided by the disclosure exhibits good holding properties for multiple resistive states.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A preparation method of a bipolar gating memristor, comprising:
preparing a lower electrode;
depositing a resistive material layer on the lower electrode, wherein the resistive material layer is a one-element metal oxide material or a multi-element metal oxide material; and
depositing an upper electrode on the resistive material layer, wherein a manner of depositing the upper electrode is:
using a magnetron sputtering manner to deposit the upper electrode on the resistive material layer, controlling upper electrode metal particles to have suitable kinetic energy by controlling sputtering power, controlling a vacuum degree of a region where the upper electrode and the resistive material layer are located, such that a redox reaction occurs spontaneously between the upper electrode and the resistive material layer during the deposition of the upper electrode to form a built-in bipolar gating layer, and continuously depositing the upper electrode on the built-in bipolar gating layer; or
selecting a material with higher activity than a metal element of the resistive material layer as a metal material of the upper electrode, depositing the upper electrode on the resistive material layer, such that a redox reaction occurs spontaneously between the upper electrode and the resistive material layer during the deposition of the upper electrode to form a built-in bipolar gating layer, and continuously depositing the upper electrode on the built-in bipolar gating layer,
wherein an oxide of the metal material of the upper electrode has bipolar gating properties, a material of the built-in bipolar gating layer is the oxide of the metal material of the upper electrode; the lower electrode, the resistive material layer, the built-in bipolar gating layer, and the upper electrode constitute the bipolar gating memristor; the bipolar gating memristor is in an off-state when forward and reverse voltages are less than or equal to a threshold voltage, and operations of erasing and writing are performed on the resistive material layer when the forward and reverse voltages are greater than the threshold voltage.

2. The preparation method according to claim 1, wherein the metal material of the upper electrode is any one of Nb, V, Ni, Cr, Ti, Co, Zr, and Ru.

3. The preparation method according to claim 1, wherein a thickness of the built-in bipolar gate layer is controlled to be 1 nm to 10 nm by controlling a process of the redox reaction.

4. The preparation method according to claim 1, wherein the controlling the vacuum degree of the region where the upper electrode and the resistive material layer are located specifically is:
controlling a vacuum degree of a region to be controlled by extracting air in the region to be controlled, introducing inert gas to the region to be controlled, and controlling a speed of introducing the inert gas, wherein the vacuum degree of the region to be controlled is controlled at $5*10^{-3}$ Pa to $5*10^{-4}$ Pa.

5. The preparation method according to claim 1, wherein a material of the lower electrode is any one of Pt, Au, Ta, Al, Pd, Hf, W, TiN, and TiW.

6. The preparation method according to claim 1, wherein a thickness of the upper electrode is 50 nm to 1 μm, a thickness of the resistive material layer is 5 nm to 50 nm, and a thickness of the lower electrode is 50 nm to 1 μm.

7. A bipolar gating memristor prepared and obtained by using the preparation method according to claim 1, wherein when magnitude of a forward voltage or a reverse voltage externally applied to the bipolar gating memristor reaches a threshold voltage of the built-in bipolar gating layer, a crystallized region is formed inside the built-in bipolar gating layer, and a resistance state of the built-in bipolar gating layer changes from an off-state resistance state to an on-state resistance state, such that the bipolar gating memristor has bidirectional switch properties, wherein during the formation of the built-in bipolar gating layer, some oxygen vacancy crystal grain regions are formed in the resistive material layer, the oxygen vacancy crystal grain regions reduce an initial resistance of the bipolar gating memristor, and the oxygen vacancy crystal grain regions are used as seeds in a process where the resistive material layer occurs a resistance change to form a crystallized conductive filament.

* * * * *